US012699142B2

(12) United States Patent
Hao et al.

(10) Patent No.: US 12,699,142 B2
(45) Date of Patent: Aug. 4, 2026

(54) METHOD AND SYSTEM FOR IDENTIFYING ELECTROCHEMICAL MODEL PARAMETERS BASED ON CAPACITY CHANGE RATE

(71) Applicant: Makesense Energy Technology Co., Limited., Shanghai (CN)

(72) Inventors: Pingchao Hao, Shanghai (CN); Xuesi Zhang, Shanghai (CN); Zhimin Zhou, Shanghai (CN); Zhou Yang, Shanghai (CN); Guopeng Zhou, Shanghai (CN); Enhai Zhao, Shanghai (CN); Xiao Yan, Shanghai (CN); Jie Zhang, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 383 days.

(21) Appl. No.: 18/371,595

(22) Filed: Sep. 22, 2023

(65) Prior Publication Data

US 2024/0110986 A1     Apr. 4, 2024

(30) Foreign Application Priority Data

Sep. 23, 2022    (CN) .......................... 202211164759.4

(51) Int. Cl.
G01R 31/374        (2019.01)
G01R 31/367        (2019.01)
                   (Continued)

(52) U.S. Cl.
CPC ......... *G01R 31/374* (2019.01); *G01R 31/367* (2019.01); *G01R 31/3835* (2019.01); *G01R 31/392* (2019.01)

(58) Field of Classification Search
CPC  G01R 31/374; G01R 31/367; G01R 31/3835; G01R 31/392; Y02E 60/10; G16C 10/00; G06F 30/20
See application file for complete search history.

(56)                References Cited

U.S. PATENT DOCUMENTS

2022/0163589 A1*  5/2022  Allam ................ G01R 31/3842
2022/0179002 A1*  6/2022  Kim .................... G01R 31/367
                    (Continued)

*Primary Examiner* — Ricky Go
(74) *Attorney, Agent, or Firm* — troutman pepper locke; Tim Tingkang Xia, Esq.

(57)                ABSTRACT

The invention provides a method and system for identifying electrochemical model parameters based on capacity change rate. The method includes: acquiring operating data from an actual operation process of a lithium battery and cleaning an actual operating data set from the operating data; generating a simulated operating data set through simulation of a preset electrochemical model; performing parameter identification based on a preset first loss function, the actual operating data set, and the simulated operating data set; calculating capacity convergence coefficient; comparing capacity convergence coefficient with a preset convergence threshold value; when greater than the preset convergence threshold value, regenerating the simulated operating data set; and when not greater than the preset convergence threshold value, outputting an electrochemical model parameter set as a parameter identification result. The invention introduces capacity change rate into the parameter identification process for lithium battery electrochemical models, improving accuracy of parameter identification.

9 Claims, 7 Drawing Sheets

(51) Int. Cl.
　　*G01R 31/3835*　　　(2019.01)
　　*G01R 31/392*　　　(2019.01)

(56)　　　　　　References Cited

U.S. PATENT DOCUMENTS

2023/0100216 A1 *　3/2023　Jung ................... H01M 10/443
　　　　　　　　　　　　　　　　　　702/63
2023/0160965 A1 *　5/2023　Kim ................... G01R 31/3835
　　　　　　　　　　　　　　　　　　702/63

* cited by examiner

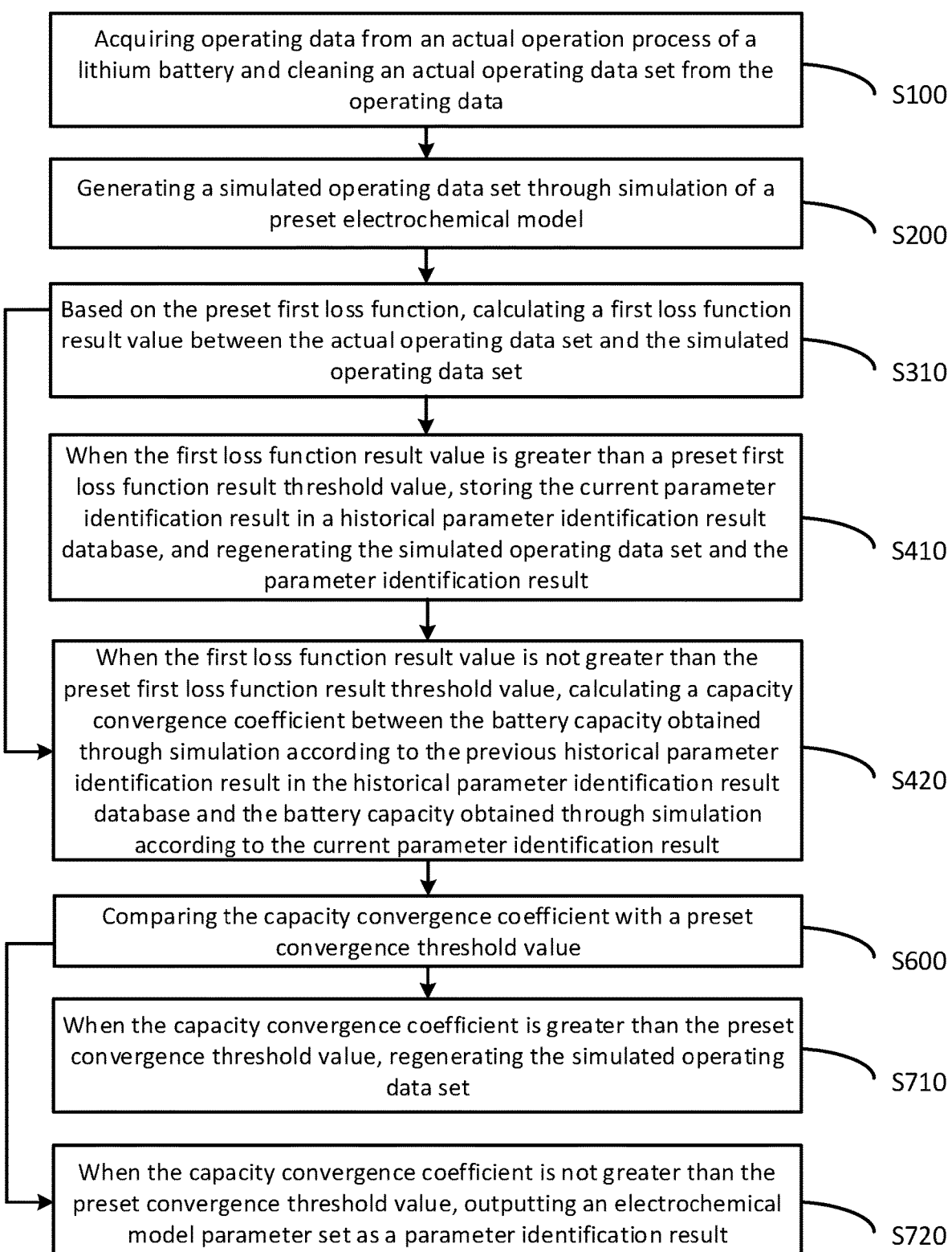

Acquiring operating data from an actual operation process of a lithium battery and cleaning an actual operating data set from the operating data    S100

Generating a simulated operating data set through simulation of a preset electrochemical model    S200

Based on the preset first loss function, calculating a first loss function result value between the actual operating data set and the simulated operating data set    S310

When the first loss function result value is greater than a preset first loss function result threshold value, storing the current parameter identification result in a historical parameter identification result database, and regenerating the simulated operating data set and the parameter identification result    S410

When the first loss function result value is not greater than the preset first loss function result threshold value, calculating a capacity convergence coefficient between the battery capacity obtained through simulation according to the previous historical parameter identification result in the historical parameter identification result database and the battery capacity obtained through simulation according to the current parameter identification result    S420

Comparing the capacity convergence coefficient with a preset convergence threshold value    S600

When the capacity convergence coefficient is greater than the preset convergence threshold value, regenerating the simulated operating data set    S710

When the capacity convergence coefficient is not greater than the preset convergence threshold value, outputting an electrochemical model parameter set as a parameter identification result    S720

FIG. 3

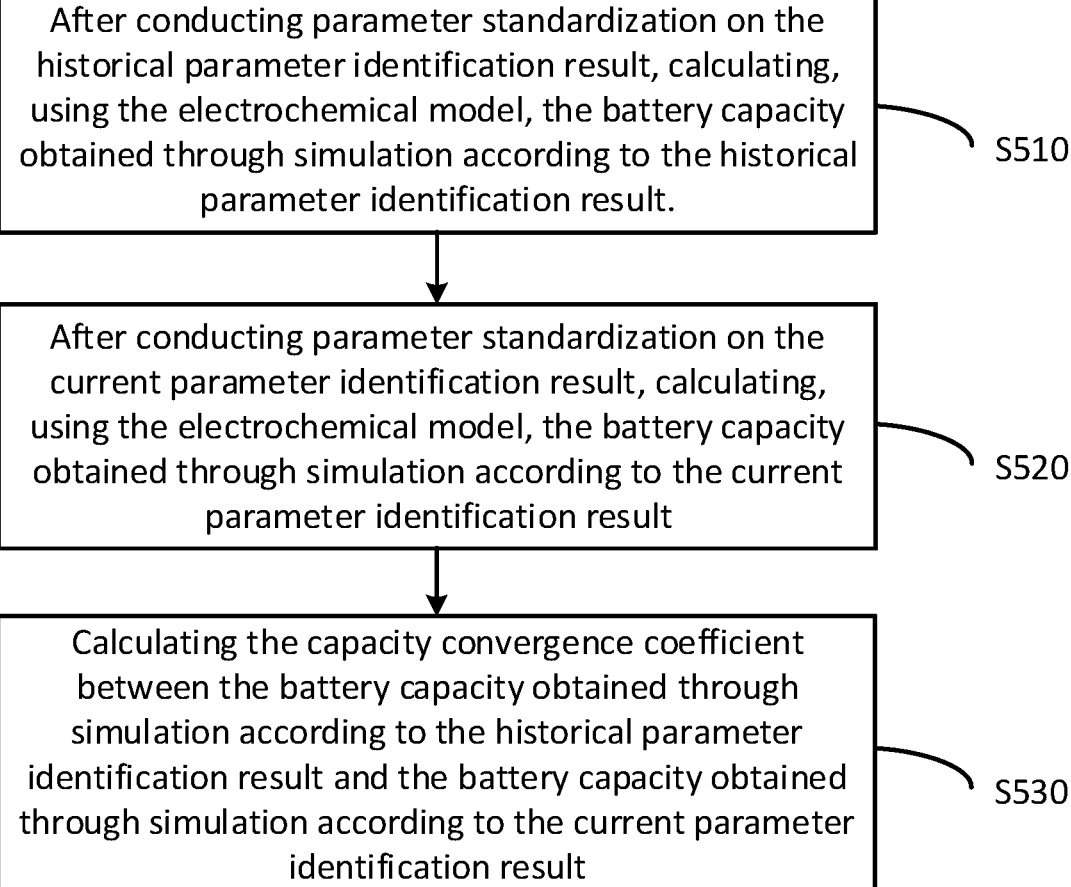

After conducting parameter standardization on the historical parameter identification result, calculating, using the electrochemical model, the battery capacity obtained through simulation according to the historical parameter identification result.    S510

After conducting parameter standardization on the current parameter identification result, calculating, using the electrochemical model, the battery capacity obtained through simulation according to the current parameter identification result    S520

Calculating the capacity convergence coefficient between the battery capacity obtained through simulation according to the historical parameter identification result and the battery capacity obtained through simulation according to the current parameter identification result    S530

FIG. 4

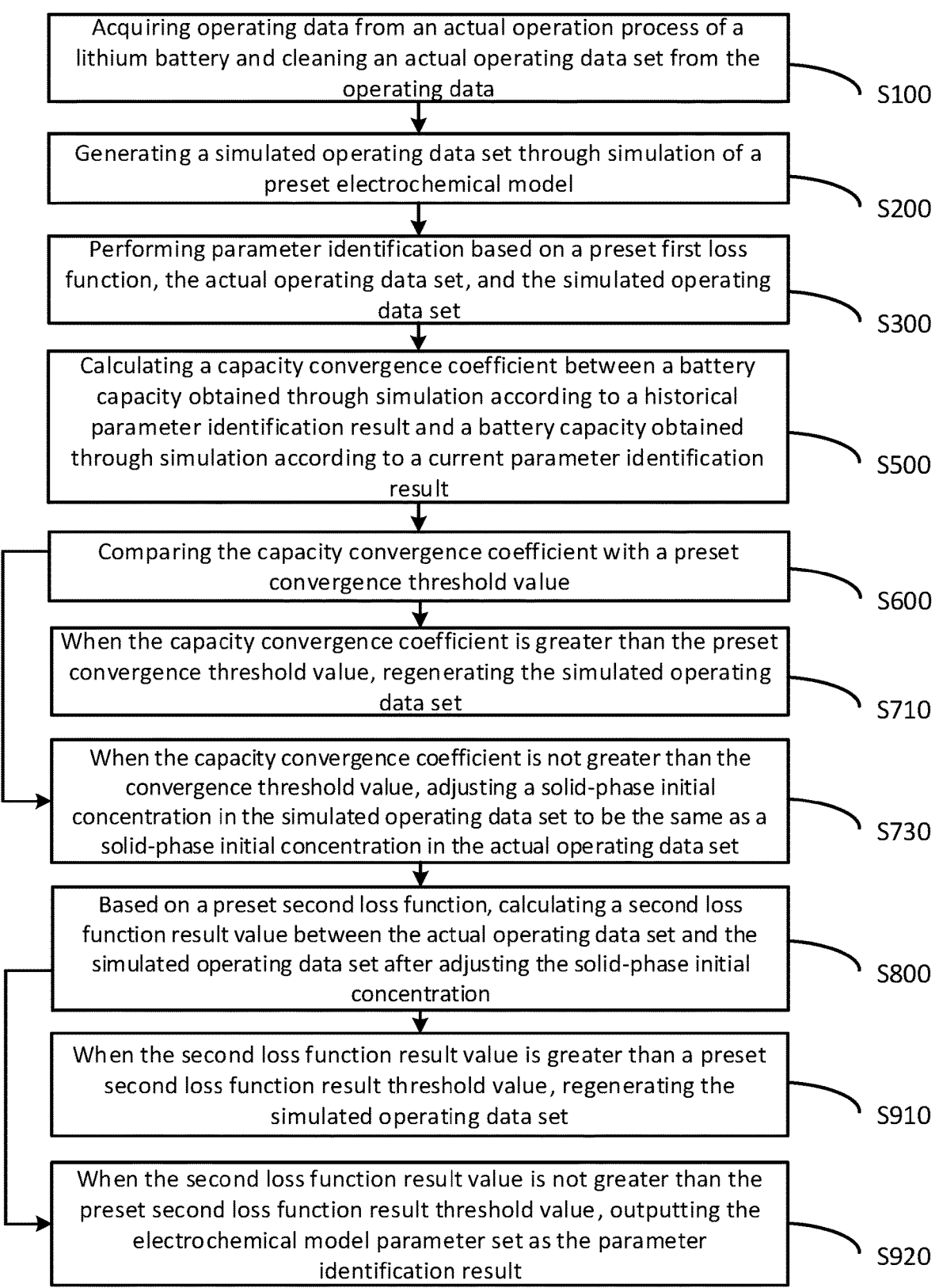

Acquiring operating data from an actual operation process of a lithium battery and cleaning an actual operating data set from the operating data — S100

Generating a simulated operating data set through simulation of a preset electrochemical model — S200

Performing parameter identification based on a preset first loss function, the actual operating data set, and the simulated operating data set — S300

Calculating a capacity convergence coefficient between a battery capacity obtained through simulation according to a historical parameter identification result and a battery capacity obtained through simulation according to a current parameter identification result — S500

Comparing the capacity convergence coefficient with a preset convergence threshold value — S600

When the capacity convergence coefficient is greater than the preset convergence threshold value, regenerating the simulated operating data set — S710

When the capacity convergence coefficient is not greater than the convergence threshold value, adjusting a solid-phase initial concentration in the simulated operating data set to be the same as a solid-phase initial concentration in the actual operating data set — S730

Based on a preset second loss function, calculating a second loss function result value between the actual operating data set and the simulated operating data set after adjusting the solid-phase initial concentration — S800

When the second loss function result value is greater than a preset second loss function result threshold value, regenerating the simulated operating data set — S910

When the second loss function result value is not greater than the preset second loss function result threshold value, outputting the electrochemical model parameter set as the parameter identification result — S920

FIG. 5

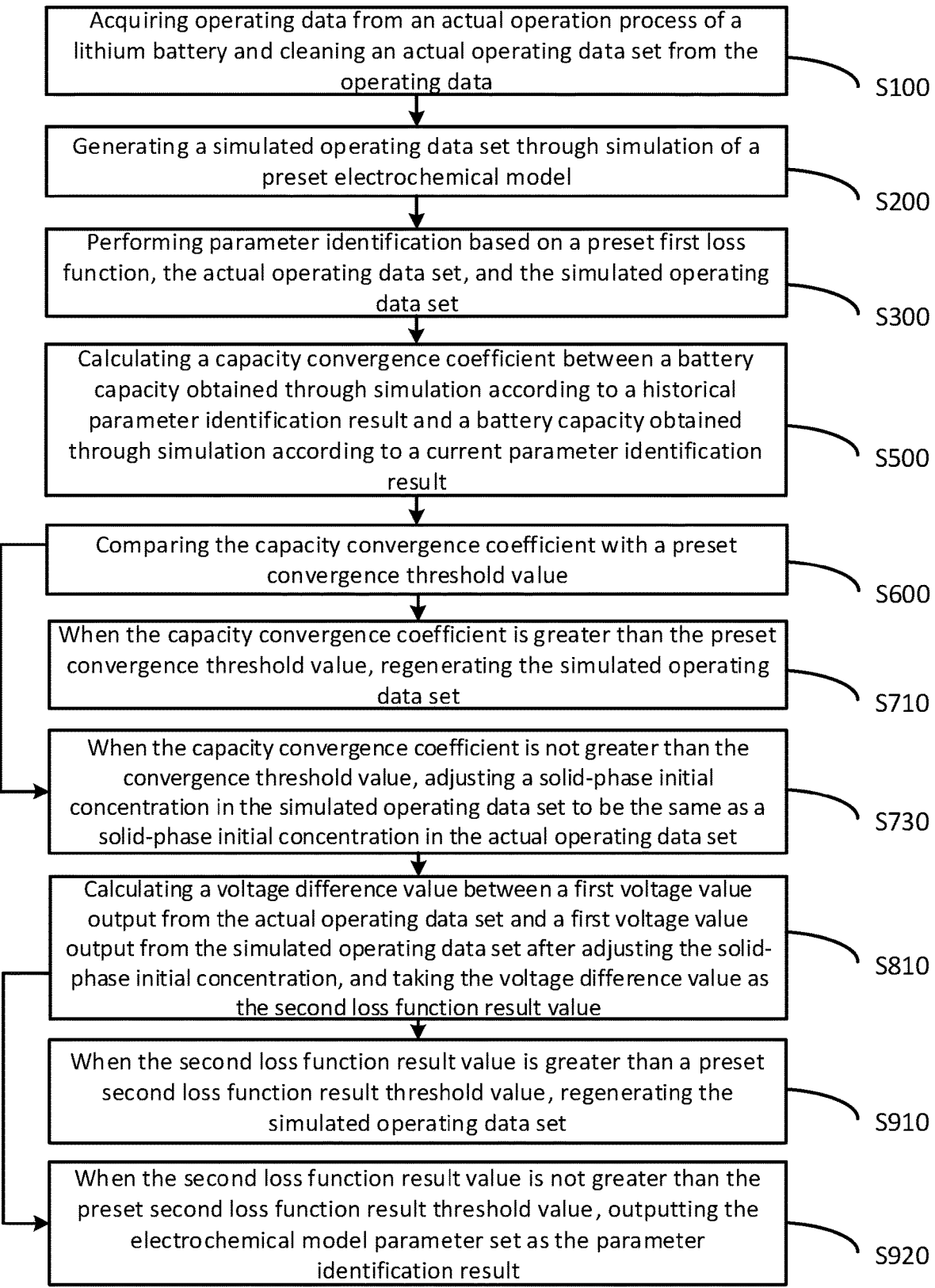

Acquiring operating data from an actual operation process of a lithium battery and cleaning an actual operating data set from the operating data — S100

Generating a simulated operating data set through simulation of a preset electrochemical model — S200

Performing parameter identification based on a preset first loss function, the actual operating data set, and the simulated operating data set — S300

Calculating a capacity convergence coefficient between a battery capacity obtained through simulation according to a historical parameter identification result and a battery capacity obtained through simulation according to a current parameter identification result — S500

Comparing the capacity convergence coefficient with a preset convergence threshold value — S600

When the capacity convergence coefficient is greater than the preset convergence threshold value, regenerating the simulated operating data set — S710

When the capacity convergence coefficient is not greater than the convergence threshold value, adjusting a solid-phase initial concentration in the simulated operating data set to be the same as a solid-phase initial concentration in the actual operating data set — S730

Calculating a voltage difference value between a first voltage value output from the actual operating data set and a first voltage value output from the simulated operating data set after adjusting the solid-phase initial concentration, and taking the voltage difference value as the second loss function result value — S810

When the second loss function result value is greater than a preset second loss function result threshold value, regenerating the simulated operating data set — S910

When the second loss function result value is not greater than the preset second loss function result threshold value, outputting the electrochemical model parameter set as the parameter identification result — S920

FIG. 6

METHOD AND SYSTEM FOR IDENTIFYING ELECTROCHEMICAL MODEL PARAMETERS BASED ON CAPACITY CHANGE RATE

CROSS-REFERENCE TO RELATED PATENT APPLICATION

This application claims priority to and the benefit of Chinese Patent Application No. 202211164759.4, filed Sep. 23, 2022, which is incorporated herein in its entirety by reference.

FIELD OF THE INVENTION

The invention relates generally to the field of electrochemical model technology, and more particularly to a method and a system for identifying electrochemical model parameters based on capacity change rate.

BACKGROUND OF THE INVENTION

In the conventional process of electrochemical model parameter identification, battery operating conditions are usually simulated as constant current and dynamic operating conditions, and battery data under constant current and dynamic operating conditions are identified step by step.

However, in an actual battery operation process, the battery is unlikely to always work under constant current operating conditions, which results in lower data accuracy when using this approach for parameter identification.

Therefore, there is currently a need for a method for identifying electrochemical model parameters based on capacity change rate, and the capacity change rate is introduced to improve the accuracy of parameter identification in the process of identifying electrochemical model parameters of a lithium battery.

SUMMARY OF THE INVENTION

In order to solve the technical problem of poor data accuracy after electrochemical model parameter identification in the prior art, the invention provides a method and a system for identifying electrochemical model parameters based on capacity change rate, as set forth below:

The invention provides a method for identifying electrochemical model parameters based on capacity change rate, including the following steps:

acquiring operating data from an actual operation process of a lithium battery and cleaning an actual operating data set from the operating data;

generating a simulated operating data set through simulation of a preset electrochemical model;

performing parameter identification based on a preset first loss function, the actual operating data set, and the simulated operating data set;

calculating a capacity convergence coefficient between a battery capacity obtained through simulation according to a historical parameter identification result and a battery capacity obtained through simulation according to a current parameter identification result;

comparing the capacity convergence coefficient with a preset convergence threshold value;

when the capacity convergence coefficient is greater than the preset convergence threshold value, regenerating the simulated operating data set; and when the capacity convergence coefficient is not greater than the preset convergence threshold value, outputting an electrochemical model parameter set as a parameter identification result.

The method provided by this invention addresses the technical challenges in practical battery applications that clean data cannot be obtained for constant current full charging and discharging cycles, and using a single piece of cleaned data for parameter identification can easily cause the parameters identified to be lower. By introducing constraints based on capacity change rate, this method enhances the accuracy of lithium battery electrochemical model parameter identification, combining actual battery operating data with capacity change rate to improve the effectiveness of parameter identification.

In some embodiments, after the generating the simulated operating data set through simulation of the preset electrochemical model and before the comparing the capacity convergence coefficient with the preset convergence threshold value, the method further includes:

based on the preset first loss function, calculating a first loss function result value between the actual operating data set and the simulated operating data set;

when the first loss function result value is greater than a preset first loss function result threshold value, storing the current parameter identification result in a historical parameter identification result database, and regenerating the simulated operating data set and the parameter identification result; and when the first loss function result value is not greater than the preset first loss function result threshold value, calculating a capacity convergence coefficient between the battery capacity obtained through simulation according to the previous historical parameter identification result in the historical parameter identification result database and the battery capacity obtained through simulation according to the current parameter identification result.

In some embodiments, the first loss function includes a voltage mean square error loss function, and the calculating the first loss function result value between the actual operating data set and the simulated operating data set based on the preset first loss function includes:

calculating a voltage mean square error between the actual operating data set and the simulated operating data set as the first loss function result value, wherein a formula is as follows:

$$MSE = 1/N \sum\nolimits_{i=1}^{N} (V_{sim,i} - V_{real,i})^2;$$

wherein $V_{sim,i}$ is a model simulation output voltage value of the ith sampling point in the simulated operating data set, $V_{real,i}$ is a measured voltage value of the ith sampling point of the actual operating data set, and N is a number of voltage data points.

In some embodiments, the calculating the capacity convergence coefficient between the battery capacity obtained through simulation according to the historical parameter identification result and the battery capacity obtained through simulation according to the current parameter identification result includes:

after conducting parameter standardization on the historical parameter identification result, calculating, using the electrochemical model, the battery capacity obtained through simulation according to the historical parameter identification result;

after conducting parameter standardization on the current parameter identification result, calculating, using the electrochemical model, the battery capacity obtained through simulation according to the current parameter identification result; and calculating the capacity convergence coefficient between the battery capacity obtained through simulation according to the historical parameter identification result and the battery capacity obtained through simulation according to the current parameter identification result, wherein a formula is as follows:

$$\delta = \left| \frac{C_{max,k} - C_{max,k-1}}{C_{max,k-1}} \right|;$$

wherein $\delta$ is the capacity convergence coefficient, $C_{max,k-1}$ is the battery capacity obtained through simulation according to the historical parameter identification result, and $C_{max,k}$ is the battery capacity obtained through simulation according to the current parameter identification result.

In some embodiments, after the comparing the capacity convergence coefficient with the preset convergence threshold value, the method further includes:

when the capacity convergence coefficient is not greater than the convergence threshold value, adjusting a solid-phase initial concentration in the simulated operating data set to be the same as a solid-phase initial concentration in the actual operating data set;

based on a preset second loss function, calculating a second loss function result value between the actual operating data set and the simulated operating data set after adjusting the solid-phase initial concentration;

when the second loss function result value is greater than a preset second loss function result threshold value, regenerating the simulated operating data set; and when the second loss function result value is not greater than the preset second loss function result threshold value, outputting the electrochemical model parameter set as the parameter identification result.

The method provided by this invention further improves the generalization capability and accuracy of electrochemical model parameters by adjusting the solid-phase initial concentration in the simulated operating data set and according to the loss function result between the actual operating data set and the simulated operating data set after adjusting the solid-phase initial concentration.

In some embodiments, the second loss function includes a voltage difference loss function, and the based on the preset second loss function, calculating the second loss function result value between the actual operating data set and the simulated operating data set after adjusting the solid-phase initial concentration includes:

calculating a voltage difference value between a first voltage value output from the actual operating data set and a first voltage value output from the simulated operating data set after adjusting the solid-phase initial concentration, and taking the voltage difference value as the second loss function result value, wherein a formula is as follows:

$$|V_{sim,1} - V_{real,1}|;$$

wherein $V_{sim,1}$ is a model simulation output first voltage value from the simulated operating data set, and $V_{real,1}$ is a measured first voltage value from the actual operating data set for the lithium battery.

In some embodiments, the second loss function further includes a voltage mean square error loss function.

In some embodiments, a battery idle period exists before an initial operating data in the actual operating data set, the battery idle period being longer than a preset time length; and an SOC change interval in the actual operating data set is greater than a preset SOC change threshold value.

In some embodiments, according to another aspect of the invention, there is also provided a system for identifying electrochemical model parameters based on capacity change rate, including:

an acquisition module, configured to acquire operating data from an actual operation process of a lithium battery and clean an actual operating data set from the operating data;

a simulation module, configured to generate a simulated operating data set through simulation of a preset electrochemical model;

an identification module, respectively connected with the acquisition module and the simulation module, configured to perform parameter identification based on a preset first loss function, the actual operating data set, and the simulated operating data set;

a calculation module, respectively connected with the identification module and the simulation module, configured to calculate a capacity convergence coefficient between a battery capacity obtained through simulation according to a historical parameter identification result and a battery capacity obtained through simulation according to a current parameter identification result;

a comparison module, connected with the calculation module, configured to compare the capacity convergence coefficient with a preset convergence threshold value;

a generation module, connected with the comparison module, configured to regenerate the simulated operating data set when the capacity convergence coefficient is greater than the preset convergence threshold value; and an output module, connected with the comparison module, configured to output an electrochemical model parameter set as a parameter identification result when the capacity convergence coefficient is not greater than the preset convergence threshold value.

In some embodiments, according to another aspect of the invention, there is also provided a storage medium on which at least one instruction is stored, wherein the at least one instruction is loaded and executed by a processor to implement operations of the method for identifying electrochemical model parameters based on capacity change rate as described above.

The invention provides at least one of the following technical effects:

(1) Solving the technical problem in practical battery applications that clean data cannot be obtained for constant current full charging and discharging cycles, and using a single piece of cleaned data for parameter identification can easily cause the parameters identified to be lower, enhancing the accuracy of lithium battery electrochemical model parameter identification by introducing constraints based on capacity change rate, and improving the effectiveness of parameter identification by combining actual battery operating data with capacity change rate;

(2) Further improving the generalization capability and accuracy of the electrochemical model parameters by adjusting the solid-phase initial concentration in the simulated operating data set and according to the loss function result between the actual operating data set and the simulated operating data set after adjusting the solid-phase initial concentration.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

FIG. 3 is a flowchart of calculating a first loss function result value in a method for identifying electrochemical model parameters based on capacity change rate according to the invention;

FIG. 4 is a flowchart of calculating a capacity convergence coefficient in a method for identifying electrochemical model parameters based on capacity change rate according to the invention;

FIG. 5 is a flowchart of calculating a second loss function result value in a method for identifying electrochemical model parameters based on capacity change rate according to the invention;

FIG. 6 is another flowchart of calculating a second loss function result value in a method for identifying electrochemical model parameters based on capacity change rate according to the invention;

Figure 1:
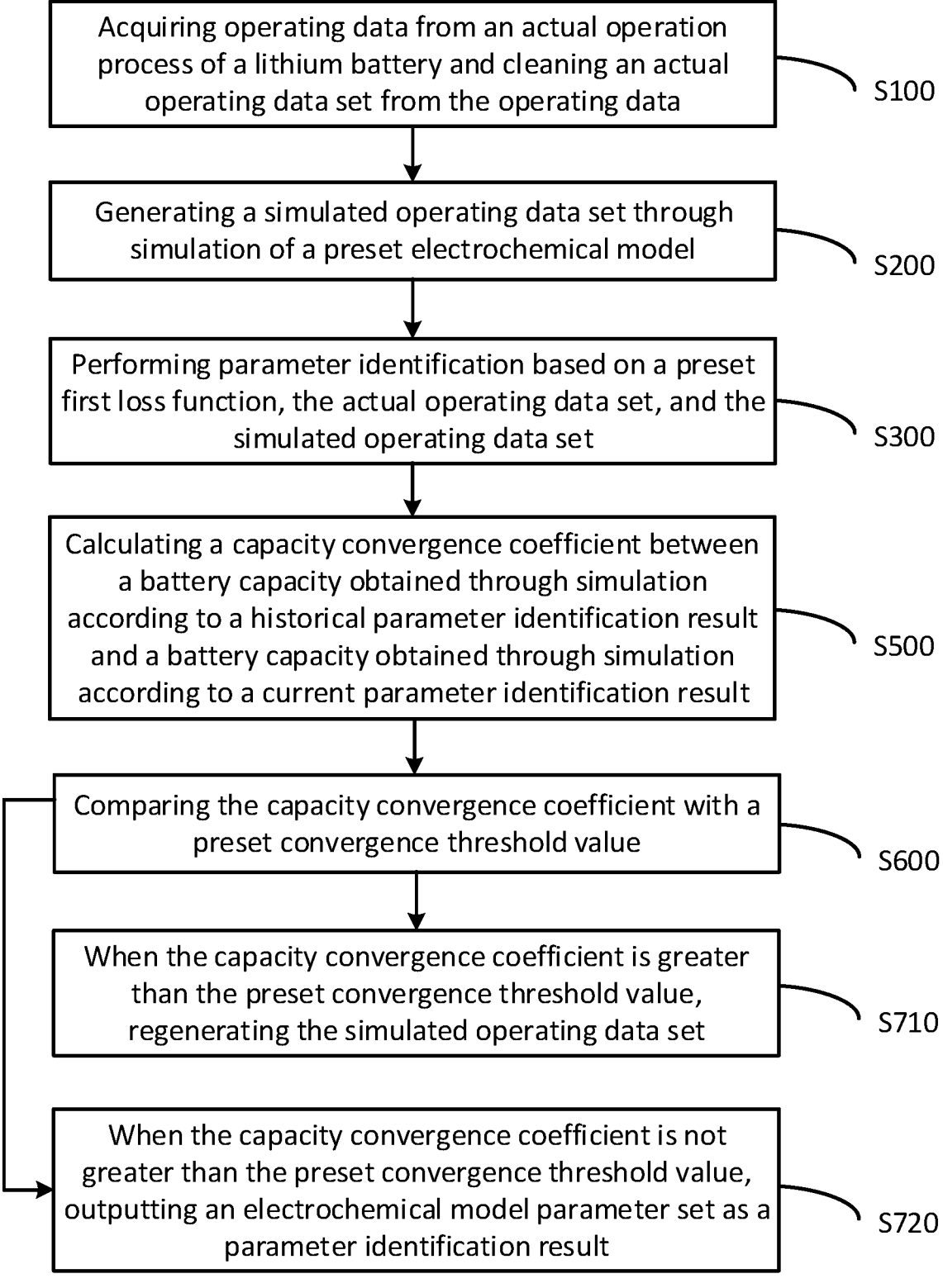
FIG. 1 is a flowchart of a method for identifying electrochemical model parameters based on capacity change rate according to the invention.

Reference numbers in the figures: an acquisition module—10, a simulation module—20, an identification module—30, a calculation module—40, a comparison module—50, a generation module—60, and an output module—70.

DETAILED DESCRIPTION OF THE INVENTION

Embodiments of the invention are described below through specific examples in conjunction with the accompanying drawings in FIGS. 1-7, and those skilled in the art can easily understand other advantages and effects of the invention from the content disclosed in this specification. The invention can also be implemented or applied through other different specific implementations, and various modifications or changes can be made to the details in this specification according to different viewpoints and applications without departing from the spirit of the invention. It should be noted that, in the case of no conflict, the following embodiments and features in the embodiments can be combined with each other.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. For components with the same structure or function in some figures, only one of them is schematically shown, or only one of them is marked. They do not represent the actual structure of the product. Dimensional drawing, the type, quantity and proportion of each component can be changed arbitrarily in its actual implementations. More complicated component layouts may also become apparent in view of the drawings, the specification, and the following claims.

The terminology used herein is for the purpose of describing particular embodiments only and is not intended to be limiting of the invention. As used herein, "a" not only means "only one," but also means "more than one." The term "and/or" used in the description of the present application and the appended claims refers to any combination and all possible combinations of one or more of the associated listed items, and includes these combinations. The terms "first," "second," etc. are only used for distinguishing descriptions, and should not be construed as indicating or implying relative importance.

It should be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

In order to more clearly illustrate the embodiments of the invention or the technical solutions in the prior art, the following description will explain the specific embodiments of the invention with reference to the accompanying drawings. It is evident that the drawings in the following description are only examples of the invention, from which other drawings and other embodiments can be obtained by a person skilled in the art without inventive effort.

In one embodiment, as shown in FIG. 1, the invention provides a method for identifying electrochemical model parameters based on capacity change rate, including the following steps:

S100, acquiring operating data from an actual operation process of a lithium battery and cleaning an actual operating data set from the operating data.

Specifically, because there are numerous parameters in an electrochemical model of the lithium battery, in order to ensure accuracy of parameter identification and generalization capability of parameter sets, conventional parameter identification methods based on experimental data need to acquire full charge and discharge data of the battery under different operating conditions, such as data from SOC=100% to SOC=0% under 1C conditions (constant current operating condition) of the battery, and data from SOC=100% to SOC=0% under dynamic operating conditions. However, in practical battery operation within a power station, it is challenging to maintain ideal constant current operating conditions, making it difficult to acquire data from SOC=100% to SOC=0% under such constant current operating conditions. Therefore, an actual operating data set required by parameter identification needs to be cleaned from the operating data.

Furthermore, in the process of cleaning the actual operating data set, it is possible to clean only the actual operating data set of a single battery cell within the battery, or to clean the actual operating data set of multiple battery cells within the battery.

Illustratively, in the process of cleaning the actual operating data set from the operating data, two conditions need to be met: that a battery idle period longer than a preset time length exists before initial operating data in the actual operating data set, and an SOC change interval in the actual operating data set is greater than a preset SOC change threshold value. For example, the battery cell should remain idle for more than 1 hour to ensure that it reaches an equilibrium state internally when it begins to work, and the SOC change interval should be large enough to cover more than 70% of SOC fluctuations.

S200, generating a simulated operating data set through simulation of a preset electrochemical model.

Specifically, in the implementation process of the technical solution disclosed in the present application, different electrochemical models, such as an AMESim electrochemical model, a P2D electrochemical model, and a P2D thermally coupled electrochemical model, among others, may be used.

S300, performing parameter identification based on a preset first loss function, the actual operating data set, and the simulated operating data set.

Specifically, whether the first loss function result value of the actual operating data set and the simulated operating data set meets an expected threshold interval is judged, and if yes, the parameter identification result is judged to be accurate, and if not, the parameter identification result is judged to be inaccurate.

S500, calculating a capacity convergence coefficient between a battery capacity obtained through simulation according to a historical parameter identification result and a battery capacity obtained through simulation according to a current parameter identification result.

Specifically, in the actual electrochemical model parameter identification process, it is difficult to ensure the reliability of the parameter set because only one piece of data for parameter identification is cleaned for each group of cells or each cell. That is, the generalization capability of the parameter set is poor, and therefore, in this embodiment, the reliability of parameter identification is improved by increasing constraints based on capacity change rate. The accuracy of parameter identification is evaluated by the capacity convergence coefficient.

S600, comparing the capacity convergence coefficient with a preset convergence threshold value.

Specifically, the convergence threshold value may be determined according to a state of the battery. Under normal aging conditions, the capacity of the battery does not exhibit sudden changes, so a convergence threshold value of 3% may be selected. If the simulation accuracy of the electrochemical model is high, the convergence threshold value may be reduced to improve the accuracy of parameter identification.

S710, when the capacity convergence coefficient is greater than the preset convergence threshold value, regenerating the simulated operating data set.

Specifically, when the capacity convergence coefficient is greater than the convergence threshold value, it is determined that the parameter identification result has poor accuracy, so that group of electrochemical model parameter set is discarded, the electrochemical model parameter set is updated, and the simulated operating data set is regenerated.

S720, when the capacity convergence coefficient is not greater than the preset convergence threshold value, outputting an electrochemical model parameter set as a parameter identification result.

The method for identifying electrochemical model parameters based on capacity change rate solves the technical problems that clean data cannot be obtained for constant current full charging and discharging cycles and mitigates the problem of obtaining lower parameters during parameter identification when using a single piece of cleaned data. The method enhances the accuracy of lithium battery electrochemical model parameter identification by introducing constraints based on capacity change rate, and it improves the effectiveness of parameter identification by combining actual battery operating data with capacity change rate.

Figure 2:
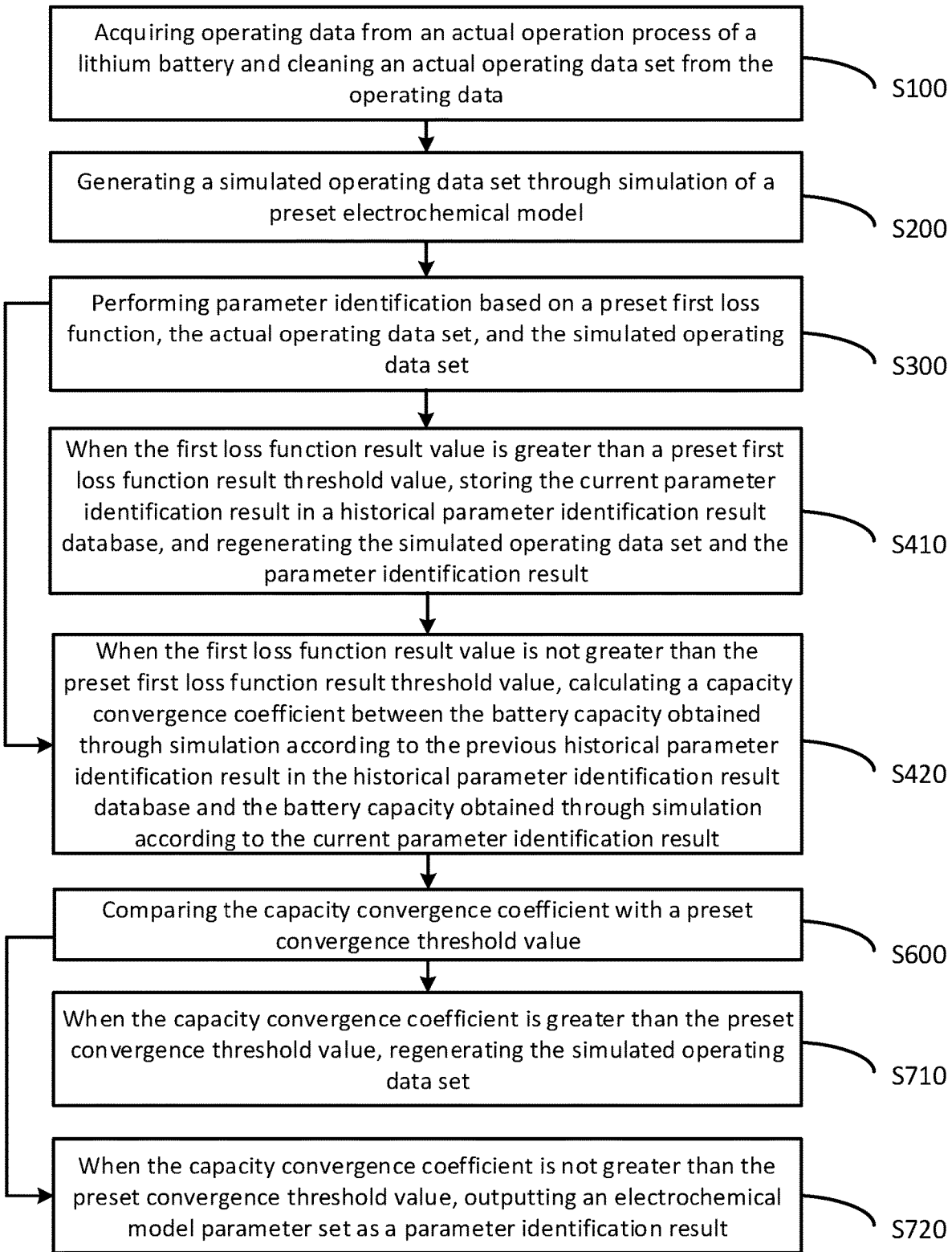
FIG. 2 is another flowchart of a method for identifying electrochemical model parameters based on capacity change rate according to the invention.

In one embodiment, as shown in FIG. 2, after step S200, generating the simulated operating data set through simulation of the preset electrochemical model, and before step S500, comparing the capacity convergence coefficient with the preset convergence threshold value, the method further includes the steps of:

S310, based on the preset first loss function, calculating a first loss function result value between the actual operating data set and the simulated operating data set.

S410, when the first loss function result value is greater than a preset first loss function result threshold value, storing the current parameter identification result in a historical parameter identification result database, and regenerating the simulated operating data set and the parameter identification result.

S420, when the first loss function result value is not greater than the preset first loss function result threshold value, calculating a capacity convergence coefficient between the battery capacity obtained through simulation according to the previous historical parameter identification result in the historical parameter identification result database and the battery capacity obtained through simulation according to the current parameter identification result.

Specifically, in the process of executing step S410, when the current parameter identification result is stored in the historical parameter identification result database with a timestamp, it allows for when the first loss function result value is not greater than the first loss function result threshold value, extraction of the battery capacity obtained through simulation according to the previous historical parameter identification result in the historical parameter identification result database according to the timestamp.

According to the method provided in this embodiment, before conducting parameter identification based on capacity change rate, parameter identification is carried out according to a first loss function result value between an actual operating data set and a simulated operating data set, further improving parameter identification accuracy.

In one embodiment, as shown in FIG. 3, the step S300 involves calculating the first loss function result value between the actual operating data set and the simulated operating data set based on the preset first loss function, including:

S310, calculating a voltage mean square error between the actual operating data set and the simulated operating data set as the first loss function result value.

Specifically, the formula for calculating the first loss function result value is as follows:

$$MSE = 1/N \sum_{i=1}^{N} (V_{sim,i} - V_{real,i})^2;$$

wherein $V_{sim,i}$ is a model simulation output voltage value of the ith sampling point in the simulated operating data set, $V_{real,i}$ is a measured voltage value of the ith sampling point of the actual operating data set, and N is a number of voltage data points.

In one embodiment, as shown in FIG. 4, the step S500 involves calculating a capacity convergence coefficient between a battery capacity obtained through simulation according to a historical parameter identification result and a battery capacity obtained through simulation according to a current parameter identification result, including:

S510, after conducting parameter standardization on the historical parameter identification result, calculating, using the electrochemical model, the battery capacity obtained through simulation according to the historical parameter identification result.

Specifically, based on the input historical parameter identification results, the electrochemical model simulates and performs a standard charging process for the lithium battery at a preset state of charge. During this simulation, it calculates the volume average concentration of lithium ions in both the positive electrode and negative electrode.

Exemplarily, consider simulating a standard charging process of a lithium cobaltate cell when the SOC=100% according to an electrochemical model after inputting the historical parameter identification result. The lithium battery should be charged to 4.2V at 0.5C first, upon which the voltage is maintained at 4.2V until the current is reduced to 0.05C. The volume average concentration of the lithium ions in the positive electrode and the volume average concentration of the lithium ions in the negative electrode are calculated according to a simulated data set output by the electrochemical model.

After obtaining the volume average concentration of the lithium ions of the positive electrode and the volume average concentration of the lithium ions of the negative electrode when the SOC=100%, an electrochemical model should be controlled to simulate a standard discharge process so as to obtain the capacity after model parameters are modified. The calculation formula of the capacity of the lithium battery is as follows:

$$Q_{dis} = \int I dt;$$

wherein $Q_{dis}$ is the discharge capacity of the lithium battery during the simulation process according to a standard discharge process of the battery cell, so that the voltage of the lithium battery is reduced to 2.5V from 0.5C.

S520, after conducting parameter standardization on the current parameter identification result, calculating, using the electrochemical model, the battery capacity obtained through simulation according to the current parameter identification result.

Specifically, according to the method in step S510, the battery capacity obtained through the electrochemical model simulated output according to the current parameter identification result in the state of charge is calculated.

S530, calculating the capacity convergence coefficient between the battery capacity obtained through simulation according to the historical parameter identification result and the battery capacity obtained through simulation according to the current parameter identification result.

Specifically, the formula for calculating the capacity convergence coefficient is as follows:

$$\delta = \left| \frac{C_{max,k} - C_{max,k-1}}{C_{max,k-1}} \right|;$$

wherein $\delta$ is the capacity convergence coefficient, $C_{max,k-1}$ is the battery capacity obtained through simulation according to the historical parameter identification result, and $C_{max,k}$ is the battery capacity obtained through simulation according to the current parameter identification result.

In one embodiment, as shown in FIG. 5, after comparing the capacity convergence coefficient with a preset convergence threshold value in step S600, the method further includes the steps of:

S730, when the capacity convergence coefficient is not greater than the convergence threshold value, adjusting a solid-phase initial concentration in the simulated operating data set to be the same as a solid-phase initial concentration in the actual operating data set.

S800, based on a preset second loss function, calculating a second loss function result value between the actual operating data set and the simulated operating data set after adjusting the solid-phase initial concentration.

S910, when the second loss function result value is greater than a preset second loss function result threshold value, regenerating the simulated operating data set.

S920, when the second loss function result value is not greater than the preset second loss function result threshold value, outputting the electrochemical model parameter set as the parameter identification result.

Specifically, after comparing the capacity convergence coefficient with the preset convergence threshold value, the solid-phase initial concentration of the identified electrochemical parameter set is adjusted to be the same as the solid-phase initial concentration in the actual operating data set, and it is determined whether the simulated operating data set after adjusting the solid-phase initial concentration is consistent with the actual operating data set corresponding to the battery cell through a second loss function. If they match, the parameter identification result is determined to be accurate, and if they do not match, the parameter identification result is determined to be inaccurate.

According to the method provided in this embodiment, the generalization capability and the accuracy of electrochemical model parameters are further improved by adjusting the solid-phase initial concentration in the simulated operating data set and according to the loss function result between the actual operating data set and the simulated operating data set after adjusting the solid-phase initial concentration.

In one embodiment, at least two actual operating data sets are cleaned in advance, for example, respectively cleaning the two actual operating data sets of a first actual operating data set and a second actual operating data set. After generating an electrochemical model parameter according to the first actual operating data set, when a capacity convergence coefficient is not greater than a convergence threshold value, a solid-phase initial concentration in a simulated operating data set is adjusted to be the same as a solid-phase initial concentration in the second actual operating data set. Based on a preset second loss function, the actual operating data set and the simulated operating data set after adjusting the solid-phase initial concentration are used to calculate a third loss function result value. When the third loss function result value is larger than a preset second loss function result threshold value, the simulated operating data set is regenerated, and when the third loss function result value is not larger than the second loss function result threshold value, the electrochemical model parameter set is output as a parameter identification result. Thus, the generalization capability of the electrochemical parameter set is verified through another piece of cleaned data.

In one embodiment, as shown in FIG. 6, step S800 involves based on a preset second loss function, calculating a second loss function result value between the actual operating data set and the simulated operating data set after adjusting the solid-phase initial concentration, including:

S810, calculating a voltage difference value between a first voltage value output from the actual operating data set and a first voltage value output from the simulated operating data set after adjusting the solid-phase initial concentration, and taking the voltage difference value as the second loss function result value.

Specifically, the formula for calculating the second loss function result value is as follows:

$$|V_{sim,1}-V_{real,1}|;$$

wherein $V_{sim,1}$ is a model simulation output first voltage value from the simulated operating data set, and $V_{real,1}$ is a measured first voltage value from the actual operating data set for the lithium battery.

Illustratively, the second loss function further includes a voltage mean square error loss function, wherein the voltage mean square error loss function is the same as the voltage mean square error loss function in step S310.

Figure 7:
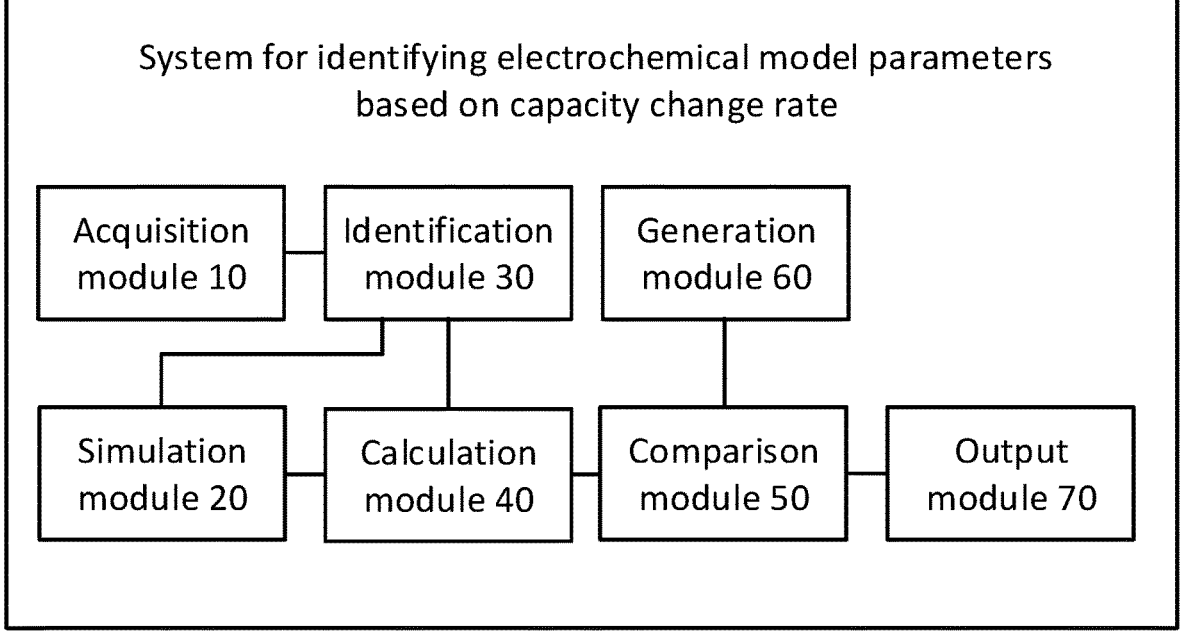
FIG. 7 is an exemplary diagram of a system for identifying electrochemical model parameters based on capacity change rate according to the invention.

In one embodiment, as shown in FIG. 7, according to another aspect of the invention, provided is a system for identifying electrochemical model parameters based on capacity change rate, which includes an acquisition module 10, a simulation module 20, an identification module 30, a calculation module 40, a comparison module 50, a generation module 60, and an output module 70.

The acquisition module 10 is configured to acquire operating data from an actual operation process of a lithium battery and clean an actual operating data set from the operating data.

Specifically, because there are numerous parameters in an electrochemical model of the lithium battery, in order to ensure accuracy of parameter identification and generalization capability of parameter sets, conventional parameter identification methods based on experimental data need to acquire full charge and discharge data of the battery under different operating conditions, such as data from SOC=100% to SOC=0% under 1C conditions (constant current operating condition) of the battery, and data from SOC=100% to SOC=0% under dynamic operating conditions. However, in practical battery operation within a power station, it is challenging to maintain ideal constant current operating conditions, making it difficult to acquire data from SOC=100% to SOC=0% under such constant current operating conditions. Therefore, an actual operating data set required by parameter identification needs to be cleaned from the operating data.

Furthermore, in the process of cleaning the actual operating data set, it is possible to clean only the actual operating data set of a single battery cell within the battery, or to clean the actual operating data set of multiple battery cells within the battery.

Illustratively, in the process of cleaning the actual operating data set from the operating data, two conditions need to be met: that a battery idle period longer than a preset time length exists before initial operating data in the actual operating data set, and an SOC change interval in the actual operating data set is greater than a preset SOC change threshold value. For example, the battery cell should remain idle for more than 1 hour to ensure that it reaches an equilibrium state internally when it begins to work, and the SOC change interval should be large enough to cover more than 70% of SOC fluctuations.

The simulation module 20 is configured to generate a simulated operating data set through simulation of a preset electrochemical model.

Specifically, in the implementation process of the technical solution disclosed in the present application, different electrochemical models, such as an AMESim electrochemical model, a P2D electrochemical model, and a P2D thermally coupled electrochemical model, among others, may be used.

The identification module 30 is respectively connected with the acquisition module 10 and the simulation module 20, and is configured to perform parameter identification based on a preset first loss function, the actual operating data set, and the simulated operating data set.

Specifically, whether the first loss function result value of the actual operating data set and the simulated operating data set meets an expected threshold interval is judged, and if yes, the parameter identification result is judged to be accurate, and if not, the parameter identification result is judged to be inaccurate.

The calculation module 40 is respectively connected with the identification module 30 and the simulation module 20, and is configured to calculate a capacity convergence coefficient between a battery capacity obtained through simulation according to a historical parameter identification result and a battery capacity obtained through simulation according to a current parameter identification result.

Specifically, in the actual electrochemical model parameter identification process, it is difficult to ensure the reliability of the parameter set because only one piece of data for parameter identification is cleaned for each group of cells or each cell. That is, the generalization capability of the parameter set is poor, and therefore, in this embodiment, the reliability of parameter identification is improved by increasing constraints based on capacity change rate. The accuracy of parameter identification is evaluated by the capacity convergence coefficient.

The comparison module 50 is connected with the calculation module 40, and is configured to compare the capacity convergence coefficient with a preset convergence threshold value.

Specifically, the convergence threshold value may be determined according to a state of the battery. Under normal aging conditions, the capacity of the battery does not exhibit sudden changes, so a convergence threshold value of 3% may be selected. If the simulation accuracy of the electrochemical model is high, the convergence threshold value may be reduced to improve the accuracy of parameter identification.

The generation module 60 is connected with the comparison module 50, and is configured to regenerate the simulated operating data set when the capacity convergence coefficient is greater than the preset convergence threshold value.

Specifically, when the capacity convergence coefficient is greater than the convergence threshold value, it is determined that the parameter identification result has poor accuracy, so that group of electrochemical model parameter set is discarded, the electrochemical model parameter set is updated, and the simulated operating data set is regenerated.

The output module 70 is connected with the comparison module 50, and is configured to output an electrochemical model parameter set as a parameter identification result when the capacity convergence coefficient is not greater than the preset convergence threshold value.

The method for identifying electrochemical model parameters based on capacity change rate solves the technical problems that clean data cannot be obtained for constant current full charging and discharging cycles and mitigates the problem of obtaining lower parameters during parameter identification when using a single piece of cleaned data. The method enhances the accuracy of lithium battery electrochemical model parameter identification by introducing constraints based on capacity change rate, and it improves the effectiveness of parameter identification by combining actual battery operating data with capacity change rate.

In some embodiments, according to another aspect of the invention, further provided is a storage medium on which at least one instruction is stored, wherein the at least one instruction is loaded and executed by a processor to implement operations of the method for identifying electrochemical model parameters based on capacity change rate, where the storage medium may be, for example, a read-only memory (ROM), a random access memory (RAM), a compact disc read-only memory (CD-ROM), a magnetic tape, a floppy disk, an optical data storage device, and the like.

In the foregoing embodiments, the descriptions focus on specific aspects of the respective embodiments, and reference may be made to the related descriptions of other embodiments for parts that are not described or recited in detail in a certain embodiment.

Those skilled in the art will recognize that the various illustrative elements and steps described in connection with the embodiments disclosed herein may be implemented as electronic hardware or combinations of computer software and electronic hardware. Whether such functionality is implemented as hardware or software depends upon the particular application and design constraints imposed on the implementation. Skilled artisans may implement the described functionality in varying ways for each particular application, but such implementations should not be considered beyond the scope of the present application.

In the embodiments provided in the present application, it should be understood that the disclosed method, system, and storage medium for simulating a data set based on an electrochemical model may be implemented in other ways. For example, the above-described embodiments of a method, system, and storage medium for simulating a data set based on an electrochemical model are merely illustrative, and the division of the modules or units is only a logical functional division. In actual implementations, other divisions may be realized, for example, multiple units or modules may be combined or integrated into another system, or some features may be omitted or not executed. Furthermore, the communication links shown or discussed with respect to each other may be realized through some interfaces, systems, or unit communication links or integrated circuits, and may take various forms including electrical, mechanical or others.

The units described as separate parts may or may not be physically separate, and parts displayed as units may or may not be physical units, may be located in one position, or may be distributed across multiple network units. Depending on actual needs, some or all of the units can be selected to achieve the objectives of this embodiment.

In addition, functional units in the embodiments of the present application may be integrated into a single processing unit, or may each exist as separate physical units, or may be integrated as two or more units within a single unit. The integrated unit can be realized in the form of hardware or in the form of a software functional unit.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:

1. A method for improving accuracy of lithium battery state estimation by identifying electrochemical model parameters based on a capacity change rate, comprising:

acquiring physical operating data from an actual operation process of a lithium battery, wherein the lithium battery has remained idle for a period longer than a preset time length to ensure an internal equilibrium state; and cleaning an actual operating data set from the physical operating data to include an SOC change interval greater than a preset threshold value;

generating a simulated operating data set through simulation of a preset electrochemical model representative of the lithium battery;

performing parameter identification of the electrochemical model based on a preset first loss function calculated between the actual operating data set and the simulated operating data set;

calculating a capacity convergence coefficient between a battery capacity obtained through simulation according to a historical parameter identification result and a battery capacity obtained through simulation according to a current parameter identification result;

comparing the capacity convergence coefficient with a preset convergence threshold value indicative of normal battery aging conditions;

when the capacity convergence coefficient is greater than the preset convergence threshold value, discarding the current parameter identification result and regenerating the simulated operating data set using updated electrochemical model parameters; and when the capacity convergence coefficient is not greater than the preset convergence threshold value, outputting an electrochemical model parameter set as a parameter identification result for use in monitoring the lithium battery.

2. The method of claim 1, wherein after the generating the simulated operating data set through simulation of the preset electrochemical model and before the comparing the capacity convergence coefficient with the preset convergence threshold value, the method further comprises:

based on the preset first loss function, calculating a first loss function result value between the actual operating data set and the simulated operating data set;

when the first loss function result value is greater than a preset first loss function result threshold value, storing the current parameter identification result in a historical parameter identification result database, and regenerating the simulated operating data set and the parameter identification result; and when the first loss function result value is not greater than the preset first loss function result threshold value, calculating a capacity convergence coefficient between the battery capacity obtained through simulation according to the previous historical parameter identification result in the historical parameter identification result database and the battery capacity obtained through simulation according to the current parameter identification result.

3. The method of claim 2, wherein the first loss function comprises a voltage mean square error loss function, and the calculating the first loss function result value between the actual operating data set and the simulated operating data set based on the preset first loss function comprises:

calculating a voltage mean square error between the actual operating data set and the simulated operating data set as the first loss function result value, wherein a formula is as follows:

$$MSE = \frac{1}{N} \sum_{i=1}^{N} (V_{sim,i} - V_{real,i})^2;$$

wherein $V_{sim,i}$ is a model simulation output voltage value of the ith sampling point in the simulated operating data set, $V_{real,i}$ is a measured voltage value of the ith sampling point of the actual operating data set, and N is a number of voltage data points.

4. The method of claim 1, wherein the calculating the capacity convergence coefficient between the battery capacity obtained through simulation according to the historical parameter identification result and the battery capacity obtained through simulation according to the current parameter identification result comprises:

after conducting parameter standardization on the historical parameter identification result, calculating, using the electrochemical model, the battery capacity obtained through simulation according to the historical parameter identification result;

after conducting parameter standardization on the current parameter identification result, calculating, using the electrochemical model, the battery capacity obtained through simulation according to the current parameter identification result; and calculating the capacity convergence coefficient between the battery capacity obtained through simulation according to the historical parameter identification result and the battery capacity obtained through simulation according to the current parameter identification result, wherein a formula is as follows:

$$\delta = \left| \frac{C_{max,k} - C_{max,k-1}}{C_{max,k-1}} \right|;$$

wherein $\delta$ is the capacity convergence coefficient, $C_{max,k-1}$ is the battery capacity obtained through simulation according to the historical parameter identification result, and $C_{max,k}$ is the battery capacity obtained through simulation according to the current parameter identification result.

5. The method of claim 1, wherein the method further comprises optimizing generalization capability of the electrochemical model parameter set by:

when the capacity convergence coefficient is not greater than the convergence threshold value, physically aligning the model state by adjusting a solid-phase initial concentration in the simulated operating data set to be the same as a solid-phase initial concentration derived from the actual physical state of the lithium battery in the actual operating data set;

performing a secondary validation based on a preset second loss function by calculating a second loss function result value between the actual operating data set and the simulated operating data set after adjusting the solid-phase initial concentration;

when the second loss function result value is greater than a preset second loss function result threshold value, identifying a mismatch between the electrochemical model and actual battery state and regenerating the simulated operating data set; and when the second loss function result value is not greater than the preset second loss function result threshold value, outputting the electrochemical model parameter set as the parameter identification result to calibrate a battery management system for accurate power station operation.

6. The method of claim 5, wherein the second loss function comprises a voltage difference loss function, and the based on the preset second loss function, calculating the second loss function result value between the actual operating data set and the simulated operating data set after adjusting the solid-phase initial concentration comprises:

calculating a voltage difference value between a first voltage value output from the actual operating data set and a first voltage value output from the simulated operating data set after adjusting the solid-phase initial concentration, and taking the voltage difference value as the second loss function result value, wherein a formula is as follows:

$$|V_{sim,1} - V_{real,1}|;$$

wherein $V_{sim,1}$ is a model simulation output first voltage value from the simulated operating data set, and $V_{real,1}$ is a measured first voltage value from the actual operating data set for the lithium battery.

7. The method of claim 5, wherein the second loss function further comprises a voltage mean square error loss function.

8. A non-transitory tangible computer-readable storage medium on which at least one instruction is stored, wherein the at least one instruction is loaded and executed by a processor to implement operations of the method for improving accuracy of lithium battery state estimation according to claim 1.

9. A system for improving accuracy of lithium battery state estimation by identifying electrochemical model parameters based on a capacity change rate, comprising:

an acquisition module, configured to acquire physical operating data from an actual operation process of a lithium battery, wherein the lithium battery has remained idle for a period longer than a preset time length to ensure an internal equilibrium state; and clean an actual operating data set from the physical operating data to include an SOC change interval greater than a preset threshold value;

a simulation module, configured to generate a simulated operating data set through simulation of a preset electrochemical model representative of the lithium battery;

an identification module, respectively connected with the acquisition module and the simulation module, configured to perform parameter identification of the electrochemical model based on a preset first loss function calculated between the actual operating data set and the simulated operating data set;

a calculation module, respectively connected with the identification module and the simulation module, configured to calculate a capacity convergence coefficient between a battery capacity obtained through simulation according to a historical parameter identification result and a battery capacity obtained through simulation according to a current parameter identification result;

a comparison module, connected with the calculation module, configured to compare the capacity convergence coefficient with a preset convergence threshold value indicative of normal battery aging conditions;

a generation module, connected with the comparison module, configured to discard the current parameter identification result and regenerate the simulated operating data set using updated electrochemical model parameters when the capacity convergence coefficient is greater than the preset convergence threshold value; and an output module, connected with the comparison module, configured to output an electrochemical model parameter set as a parameter identification result for use in monitoring the lithium battery when the capacity convergence coefficient is not greater than the preset convergence threshold value.

* * * * *